(12) United States Patent
Ooi et al.

(10) Patent No.: US 11,025,346 B2
(45) Date of Patent: *Jun. 1, 2021

(54) SYSTEMS AND METHODS FOR UNDERWATER ILLUMINATION, SURVEY, AND WIRELESS OPTICAL COMMUNICATIONS

(71) Applicant: King Abdullah University of Science and Technology, Thuwal (SA)

(72) Inventors: Boon S. Ooi, Thuwal (SA); Bilal Janjua, Thuwal (SA); Chao Shen, Thuwal (SA); Hassan M. Oubei, Thuwal (SA); Tien Khee Ng, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

This patent is subject to a terminal disclaimer.

(21) Appl. No.: 16/863,356

(22) Filed: Apr. 30, 2020

(65) Prior Publication Data
US 2020/0266902 A1 Aug. 20, 2020

Related U.S. Application Data

(63) Continuation of application No. 15/679,898, filed on Aug. 17, 2017, now Pat. No. 10,673,539.
(Continued)

(51) Int. Cl.
*H04B 13/02* (2006.01)
*H04B 10/80* (2013.01)
(Continued)

(52) U.S. Cl.
CPC ........... *H04B 13/02* (2013.01); *H01S 5/0071* (2013.01); *H04B 10/116* (2013.01);
(Continued)

(58) Field of Classification Search
CPC .... H04B 13/02; H04B 10/116; H04B 10/564; H04B 10/80; H04B 10/807;
(Continued)

(56) References Cited

U.S. PATENT DOCUMENTS 5,267,070 A 11/1993 Stewart et al.
6,813,218 B1 11/2004 Antonelli
(Continued)

FOREIGN PATENT DOCUMENTS

CN 102916744 A 2/2013

OTHER PUBLICATIONS

Akyildiz, et al., "Underwater acoustic sensor networks: research challenges," Ad Hoc Netw. 3, 257-279 (2005).
(Continued)

*Primary Examiner* — Tesfaldet Bocure
(74) *Attorney, Agent, or Firm* — Billion & Armitage

(57) ABSTRACT

Embodiments of the present disclosure describe an underwater optical communication and illumination system employing laser diodes directly encoded with data, including spectrally efficient orthogonal frequency division multiplex quadrature amplitude modulation (QAM-OFDM) data. A broadband light source may be utilized to provide both illumination to an underwater field of interest and underwater optical communication from the field of interest to a remote location.

20 Claims, 6 Drawing Sheets

Related U.S. Application Data

(60) Provisional application No. 62/379,565, filed on Aug. 25, 2016.

(51) Int. Cl.
  *H04L 27/26* (2006.01)
  *H04B 10/564* (2013.01)
  *H01S 5/00* (2006.01)
  *H04B 10/116* (2013.01)

(52) U.S. Cl.
  CPC ........... *H04B 10/564* (2013.01); *H04B 10/80* (2013.01); *H04B 10/807* (2013.01); *H04L 27/2698* (2013.01)

(58) Field of Classification Search
  CPC ............. H01S 5/00711; H04L 27/2698; G02B 2027/0118; G02B 27/017
  USPC ......................................................... 398/104
  See application file for complete search history.

(56) References Cited

U.S. PATENT DOCUMENTS

| | | |
|---|---|---|
| 7,061,454 B2 | 6/2006 | Sasuga |
| 7,953,326 B2 | 5/2011 | Farr et al. |
| 9,031,413 B2 | 5/2015 | Doniec et al. |
| 9,294,201 B2 | 3/2016 | Farr et al. |
| 2004/0134114 A1 | 7/2004 | Afshari |
| 2005/0232638 A1 | 10/2005 | Fucile et al. |
| 2008/0048106 A1 | 2/2008 | Blanchard |
| 2013/0064556 A1 | 3/2013 | Dunn |
| 2013/0136453 A1 | 5/2013 | Uema et al. |
| 2014/0308042 A1 | 10/2014 | Woo |
| 2014/0341584 A1 | 11/2014 | Hopewell et al. |
| 2014/0363166 A1 | 12/2014 | Lacovara |
| 2015/0132004 A1 | 5/2015 | Farr et al. |
| 2016/0121009 A1 | 5/2016 | Farr et al. |
| 2016/0127042 A1 | 5/2016 | Farr et al. |
| 2017/0366278 A1 | 12/2017 | Jang |

OTHER PUBLICATIONS

Chi, et al., "450-nm GaN laser diode enables high-speed visible light communication with 9-Gbps QAM OFDM," Opt. Express 23(10), 13051-13059 (2015).

Chi, et al., "Phosphorous Diffuser Diverged Blue Laser Diode for Indoor Lighting and Communication", www.nature.com/scientificreports, Dec. 21, 2015.

Cochenour, et al., "Effect of scattering albedo on attenuation and polarization of light underwater," Opt. Lett. 35(12). 2088-2090 (2010).

Hanson, et al., "High bandwidth underwater optical communication," Appl. Opt. 47(2), 277-283 (2008).

Lin, et al., "Next-generation OFDMA-based passive optical network architecture supporting radio-over-fiber," IEEE J. Sel. Top. Area Commun. 28(6), 791-799 (2010).

Nakamura, et al., "Optical wireless transmission of 405 nm, 1.45 Gbit/s optical IM/DD-OFDM signals through a 4.8 m underwater channel," Opt. Express 23(2), 1558-1566 (2015).

Oubei, "2.3 Gbit/s underwater wireless optical communications using directly modulated 520 nm laser diode," Opt. Express 23(16), 20743-20748 (2015).

Oubei, et al., "4.8 Gbit/s 16-QAM-OFDM transmission based on compact 450-nm laser for underwater wireless optical communication", Aug. 26, 2015.

Tsonev, et al., "A 3-Gb/s Single-LED OFDM-Based Wireless VLC Link Using a Gallium Nitride µLED," IEEE Photon. Technol. Lett. 26(7), 637-640 (2014).

The related parameters of the 16-QAM-OFDM data stream.

| Symbol Length | Subcarrier Frequency Interval | Subcarrier Frequency Range | Data Bandwidth | Data Rate (Gbit/s) |
|---|---|---|---|---|
| 21.33 ns | 46.875 MHz | 0.14 to 0.54 GHz | 0.4 GHz | 1.6 |
| | | 0.14 to 0.74 GHz | 0.6 GHz | 2.4 |
| | | 0.14 to 0.94 GHz | 0.8 GHz | 3.2 |
| | | 0.14 to 1.14 GHz | 1.0 GHz | 4 |
| | | 0.14 to 1.24 GHz | 1.1 GHz | 4.4 |
| | | 0.14 to 1.34 GHz | 1.2 GHz | 4.8 |
| | | 0.14 to 1.44 GHz | 1.3 GHz | 5.2 |

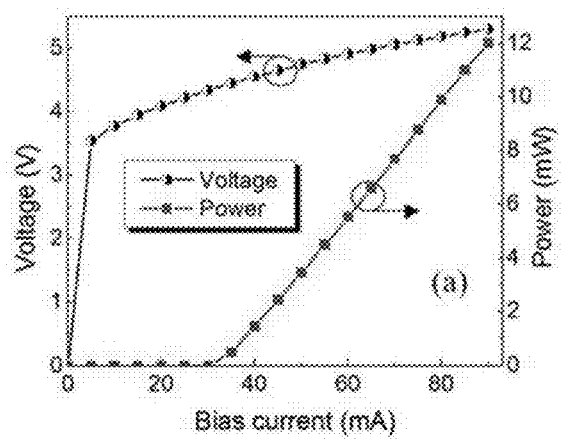
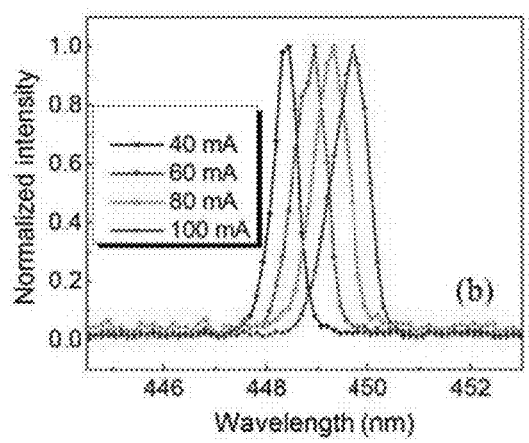
FIGURE 5A
FIGURE 5B
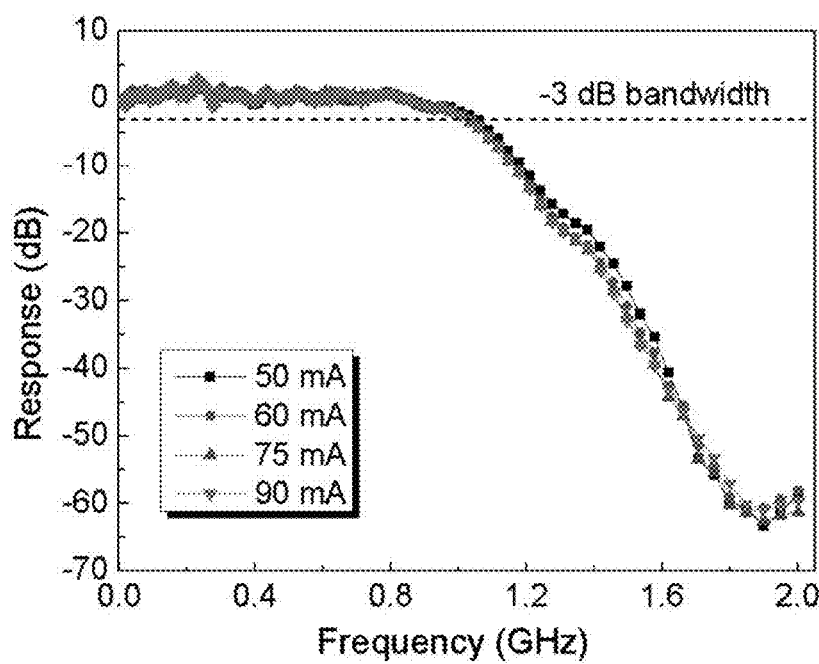
FIGURE 6

SYSTEMS AND METHODS FOR UNDERWATER ILLUMINATION, SURVEY, AND WIRELESS OPTICAL COMMUNICATIONS

CROSS-REFERENCE TO RELATED APPLICATION

This application is a continuation of U.S. patent application Ser. No. 15/679,898, now issued as U.S. Pat. No. 10,673,539 on Jun. 2, 2020.

BACKGROUND

Underwater human activities such as oceanography studies, offshore oil exploration, sea floor surveying and environmental monitoring have increased significantly. As a result, there is a growing need for reliable illumination and high data-rate underwater wireless communication (UWOC) systems. Traditionally, visible light sources have been separate from underwater communication systems. A variety of illumination devices are known, including for example, incandescent and LED sources. Acoustic communication systems are also well known. However, the bandwidth of an underwater acoustic channel is limited to hundreds of kHz because of strong frequency dependent attenuation of sound in seawater. The slow propagation of sound waves causes large time delay in acoustic communication systems. In addition, radio frequency (RF) communication is severely limited due to the conductivity of seawater at radio frequencies.

SUMMARY

Optical-based UWOC systems have gained interest from military and academic research communities and have been proposed as an alternative or complementary solution to acoustic and RF underwater communication links over short and moderate distances (less than 100 m). Technological advances in visible light emitters, receivers, digital communications and signal processing now exploit the low absorption of seawater in the blue-green (400-550 nm) region of the visible light window of electromagnetic spectrum. A goal of an optical-based UWOC system is to provide high data-rates to transmit large data capacity for versatile applications such as underwater oil pipe inspection, remotely operated vehicle (ROV) and sensor networks.

The underwater propagation of light is governed by attenuation which is a combined effect of absorption and scattering mechanisms. Because of the aquatic environment is optically very challenging, the effect of multiple scattering especially in turbid littoral waters strongly degrades bit error rate (BER) performance of the on-off keying (OOK) based high data-rate UWOC systems.

In general, embodiments of the present disclosure describe an underwater vision (illumination) and wireless optical communication system employing GaN based light source for giga-bit-per-second data rate over long distance (5-20 meters and beyond). In some embodiments, a broadband light is composed of multiple wavelengths laser, for white-light illumination and communications. In other embodiments of the present disclosure, a UWOC system utilizing a violet or blue laser combined with phosphor material in the transmitter module to generate white light, can be used for both underwater vision and communications. The phosphor material used for white light generation refers to a kind of color conversion material that can be excited by violet or blue laser and generate blue, green, yellow or red color. By mixing those colors, white light with different color rendering index and color temperature can be achieved. In yet other embodiments of the present disclosure, a UWOC system with red-green-blue (RGB) lasers can be utilized to generate light at specific wavelength ranges. By mixing light from RGB lasers, light with different color rendering indices or color temperatures can be achieved. In yet other embodiments of the present disclosure, ultraviolet (UV) lasers can be utilized to provide both illumination and non-line-of-sight underwater communications.

Embodiments of the present disclosure further describe various spectral-efficient techniques, such as orthogonal-frequency division multiplexing, and spectral multiplexing techniques, including wavelength division multiplexing, as well as low light detection methods for long distance underwater communications.

Embodiments of the present invention include a light source used in conjunction with discrete optics to provide point-to-point underwater data communication and also to illuminate an underwater environment by providing visible light useful, for example, to conduct underwater exploration or other activities.

The details of one or more examples are set forth in the description below. Other features, objects, and advantages will be apparent from the description and from the claims.

BRIEF DESCRIPTION OF DRAWINGS

This written disclosure describes illustrative embodiments that are non-limiting and non-exhaustive. In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

Reference is made to illustrative embodiments that are depicted in the figures, in which:

FIG. 5A illustrates a graphical view of light-current-voltage (LIV) characteristics of the TO-9 packaged LD.

FIG. 5B illustrates a graphical view of lasing spectra versus wavelength at 250 C under different bias currents.

FIG. 6 illustrates the small-signal modulation response at different bias currents of the blue laser diode.

DETAILED DESCRIPTION

Figure 1:
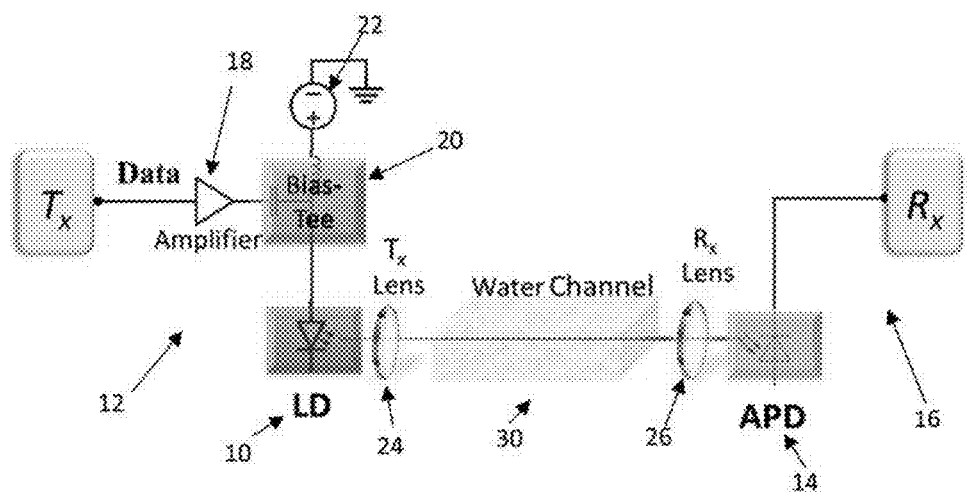
FIG. 1 illustrates a schematic of a laser diode (LD) based UWOC system in accordance with one or more embodiment of the present invention.

The invention of the present disclosure relates to a laser diode-based underwater illumination and wireless optical communication (LD-UWOC) system. In one embodiment, a LD-UWOC system yields a data rate of 1.5 Gbps over a 20-meters underwater channel based on a simple non-return-to-zero on-off-keying (NRZ-OOK) modulation scheme. In another embodiment, a 16-quadrature amplitude modulation-orthogonal frequency division multiplexed (QAM-OFDM) based LD-UWOC system, yields a data rate of 4.8 Gbit/s over a 5.4-m transmission distance. For a NRZ-OOK based LD-WUOC system, a high-speed UWOC link offered a data rate up to 2 Gbps over a 12-meter-long, and 1.5 Gbps over a recorded 20-meter-long underwater channel. The measured bit-error rate (BER) are 2.8×10-5, and 3.0×10-3, respectively, satisfying forward error correction (FEC) criterion. For a 16-QAM-OFDM based LD-UWOC system, an error vector magnitude (EVM) and signal-to-noise ratio (SNR) of 16.5% and 15.63 dB, respectively, were measured with a corresponding BER is 2.6×10-3. In addition, experimental results reveal that the scattering has minimal effect on BER performance of the transmitted 1.2-GHz 16-QAM-OFDM signals for a link distance of up to 5.4-m in clear water. Therefore, longer underwater transmission is possible by simply increasing the power of the laser diode.

In some embodiments of the present disclosure, blue-light laser diodes were used as the illumination source and a Si avalanche photodetector was used in conjunction with discrete optics without the need of a diffuser. The data was encoded using a cost-effective modulation technique, for example, the non-return-to-zero on-off-keying (NRZ-OOK) modulation, and a spectral-efficient modulation technique, for example, the orthogonal frequency division multiplexed quadrature amplitude modulation (QAM-OFDM) for high-speed point-to-point data communication underwater.

Orthogonal frequency-division multiplexing (OFDM) is a method of encoding digital data on multiple carrier frequencies. OFDM is a frequency-division multiplexing scheme used as a digital multi-carrier modulation method. A large number of closely spaced orthogonal sub-carrier signals are used to carry data on several parallel data streams or channels. Each sub-carrier is modulated with a conventional modulation scheme (such as quadrature amplitude modulation or phase-shift keying) at a low symbol rate, maintaining total data rates similar to conventional single-carrier modulation schemes in the same bandwidth.

Embodiments of the present disclosure further describe an underwater illumination and wireless optical communication system based on direct modulation of GaN-based LDs utilizing the on-off-keying (OOK) or other spectral-efficient modulation techniques, such as the orthogonal frequency division multiplexing (OFDM) technique. Embodiments further describe a focused (point-to-point) high-speed communication link.

In some embodiments of the present disclosure, GaN-based violet-blue laser diodes (LDs) were used as a high power light source and high speed underwater data communication. By combining phosphor materials in the UWOC system, white light can be generated to serve as light source for vision application at the same time.

FIG. 1 is a schematic of one or more embodiments of the present disclosure with a laser diode (LD) based UWOC system employing a 450 nm laser diode 10 in the transmitter module 12 and a Si avalanche photodetector 14 in the receiver module 16. The data stream is amplified by amplifier 18 before combining at bias-tee 20 with DC bias provided by the DC power supply 22 to drive laser diode 10 (Thorlabs LP450-SF15, output power of 15 mW biasing at 137 mA). A pair of plano-convex lenses 24, 26 are used in both transmission module 12 and receiver module 16. Lenses 24, 26 (Thorlabs LA1951-a) have 25.4 mm diameter and 25.4 mm focal length to produce a parallel free-space beam. The laser beam passes through the water channel 30 and is received by photodetector 14 (Menlo Systems APD210) having an active diameter of 0.5 mm, a responsivity of 5 A/W at 450 nm and a noise equivalent power (NEP) of 0.4 pW/Hz$^{1/2}$.

One embodiment of the present disclosure describes a high-speed UWOC link offering a data rate up to 2 Gbps over a 12-meter-long, and 1.5 Gbps over a recorded 20-meter-long underwater channel has been achieved. To demonstrate the UWOC system based on OOK modulation scheme, a pattern generator was used to generate the pseudorandom binary sequence (PRBS) $2^{10}-1$ data stream in the transmitter module 12, and the data stream is amplified by the 28 dB driver amplifier before connecting with the 15 GHz broadband bias-tee. The bit-error rate (BER) for the UWOC system at 2 Gbps over a 9-m, at 2 Gbps over a 12-m, and at 1.5 Gbps over a 20-m underwater channel was measured to be $1.2\times10^{-6}$, $2.8\times10^{-5}$, and $3.0\times10^{-3}$, respectively, all passing the forward error correction (FEC) limit. Open eye diagrams and measured FEC compliant BER for a data rate of up to 2 Gbps were successfully achieved for a 9-meter as well as a 12-meter UWOC link.

Another embodiment of the present disclosure describes underwater wireless optical transmission at 4.8 Gbit/s over 5.4-m link using high-spectral efficient 16-QAM-OFDM modulation scheme. For testing the underwater wireless optical transmission system using the high-spectral efficient 16-QAM-OFDM modulation scheme, an arbitrary waveform generator (AWG) was used for signal generation and a digital serial analyzer (DSA) was used for analyzing the received signal. The 16-QAM-OFDM signals with corresponding subcarriers were generated by an offline MATLAB program and sampled by an arbitrary waveform generator with a sampling rate of 24 GS a/s.

Figure 2:
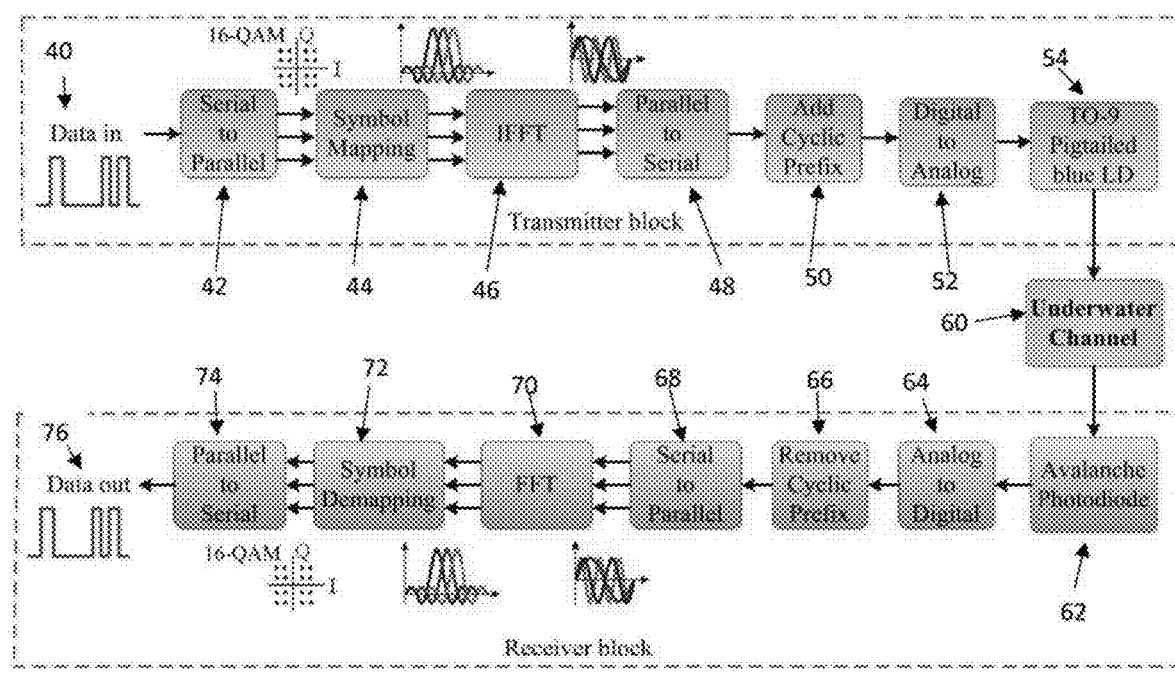
FIG. 2 illustrates a conceptual block diagram of a 16-QAM-OFDM data generation and underwater transmission system suitable for use with the embodiments of FIG. 1.
Figures 3, 4:
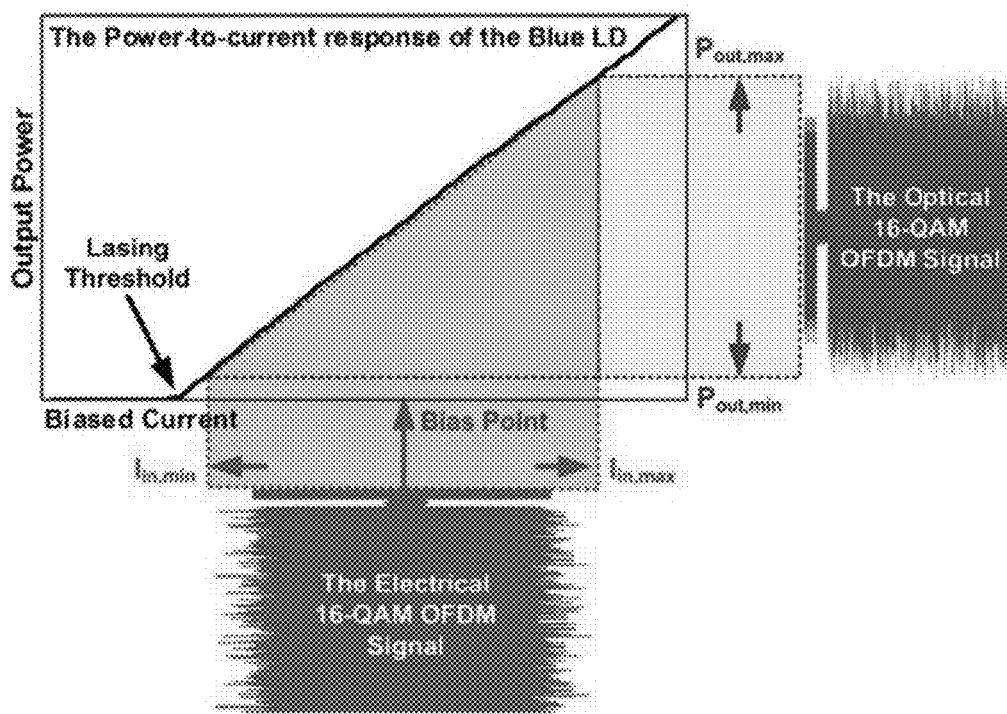
FIG. 3 is a table summarizing the related parameters of the 16-QAM-OFDM data streams delivered by a TO-9 packaged blue LD, including symbol length, subcarrier frequency and subcarrier frequency interval under different transmitted data rates.
FIG. 4 illustrates the operation of the 16-QAM-OFDM data which was directly encoded onto the TO-9 packaged blue LD after offsetting by a DC bias current.

A conceptual block diagram of the 16-QAM-OFDM data generation and underwater transmission system is illustrated in FIG. 2. Binary bit sequence 40 is divided into parallel low-speed data blocks via serial to parallel module 42 and mapped into QAM symbols via symbol mapping module 44. Inverse fast Fourier transform (IFFT) module 46 converts the QAM symbols into temporal OFDM signals with a FFT size of 512 and provides a parallel signal to parallel to serial module 48. A cyclic prefix (CP) of ⅟32 is added via cyclic prefix module 50 to mitigate inter-symbol interference (ISI) in the transmission link. FIG. 3 is a table summarizing the related parameters of the 16-QAM-OFDM data streams delivered by the TO-9 packaged blue LD, including symbol length, subcarrier frequency and subcarrier frequency interval under different transmitted data rates.

After digital-to-analog conversion (DAC) at module 52, the QAM-OFDM signals are electrically pre-amplified and directly encode the TO-9 packaged blue LD. In one embodiment, the QAM-OFDM signals were pre-amplified with a 26-dB broadband amplifier (Picosecond Pulse Labs, 5865) and then superimposed on the DC bias current using the RF connector of the built-in Bias-tee within the diode mount (Thorlabs LDM91P), which directly encodes the TO-9 packaged blue LD. The DC bias point of the TO-9 packaged blue LD was optimized for achieving largest peak-to-average power ratio (PAPR) of the modulated QAM-OFDM data stream. Electrical-to-optical domain conversion was performed according to the power-to-current response of the blue LD, leading to the optical 16-QAM-OFDM data stream with its maximal/minimal power levels determined by the maximal/minimal current levels. FIG. 4 illustrates the operation of the 16-QAM-OFDM data which was directly encoded onto the TO-9 packaged blue LD after offsetting by a DC bias current.

The collimated laser beam with an estimated divergence angle of 5.6° was then transmitted through water channel 60 filled with fresh tap water, similar to a clear ocean water type. A 15 mW (11.8 dBm) output power LD 54 would be sufficient to overcome the attenuation in clear ocean waters. The water tank with 0.6-m×0.3-m×0.3-m dimensions was made of glass. The physical light propagation distance was extended up to 5.4-m by using reflective mirrors installed at both ends of the tank. With using a 50-mm focal length lens, the output signal from the water channel was focused into a high sensitivity APD 62 with an active diameter of 0.5-mm, and a responsivity of −5 A/W at 450 nm. The power level of transmitted laser light was controlled via neutral density filters.

After optical-electrical conversion, the received analog waveform was captured by digital serial analyzer 64 with a sampling rate of 100 GSa/s and converted to digital signals. After the removal of the cyclic prefix at module 66 and further processing by serial to parallel module 68, the received OFDM signals are passed to FFT module 70, which converts to frequency-domain subcarriers and re-maps back to QAM symbols via symbol demapping module 72. Finally, parallel-to-serial module 74 was employed to convert the QAM symbols into serial on-off keying data 76. Constellation diagram, error vector magnitude (EVM), signal-to-noise ratio (SNR) and bit error rate (BER) were measured and used to evaluate the performance of this underwater wireless optical communication system. All measurements were taken under normal room illumination and no optical interference filter was used to suppress the ambient light.

The light-current-voltage (LIV) characteristics of the TO-9 packaged and fiber-pigtailed blue LD is illustrated in FIG. 5A. The threshold current and differential quantum efficiency was 3 mmA and 0.27 W/A, respectively. FIG. 5B illustrates lasing spectra versus wavelength at 250 C under different bias currents. Bias currents were measured using an Ocean Optics HR4000 Spectrometer. The nominal spectral width of the blue LD was 0.9 nm. The peak emitting wavelength was observed around 448.4 nm with the blue LD biased at 40 mA and was slightly red-shifted with increasing the bias current. The optimum wavelength of operation in an underwater optical link would depend on the water turbidity which varies widely between geographic locations.

The overall frequency response of the system including laser driver 54, underwater channel 60, and APD 62 was evaluated to determine the maximum allowable modulation bandwidth for encoding the OFDM signals. FIG. 6 represents the small-signal modulation response at different bias currents of the blue LD 54, which was measured by using a vector network analyzer. When the bias current was increased, no significant extension in LD modulation bandwidth is observed due to the combined bandwidth limitations of the LD driver 54 and the 1-GHz cut-off frequency of the APD 62. The decreased throughput intensity at high frequency region was also due to bandwidth constraints. As a result, these limitations set an upper limitation on the allowable OFDM bandwidth. The maximum −3 dB bandwidth occurred around 1.1 GHz, as indicated by the dash line in the figure.

The performance of the blue LD 54 with 1-GHz 16-QAM-OFDM data at different bias currents was initially evaluated in free-space. Both the laser bias current and the amplitude of modulating signal was adjusted to evaluate the optimized operating condition. At low bias operation, the clipping of modulating signal degrades the BER of encoded 16-QAM-OFDM data. In addition, overly driving the blue LD decreased the throughput response and ultimately degraded the high-frequency subcarrier power of the 16-QAM-OFDM data, resulting in an increased transmitted BER. The highest data rate was achieved when the bias current of blue LD and the peak-to-peak voltage of modulating signal was set to Vbias=5.01 V (Ibias=70 mA) and Vpp=0.4 V, respectively.

Figure 7A:
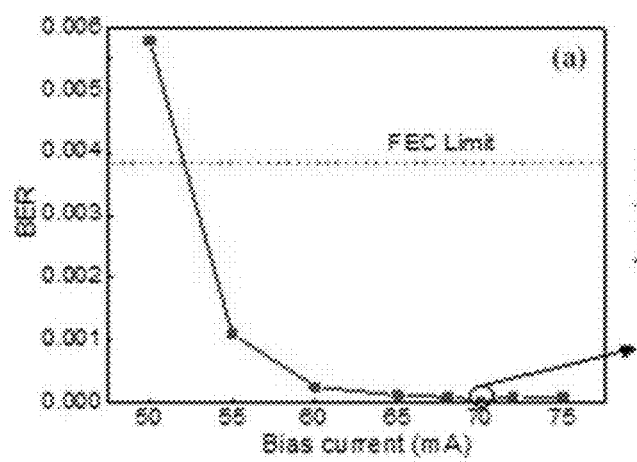
FIG. 7A illustrates a graphical view of measured BER versus laser bias current.
Figure 7B:
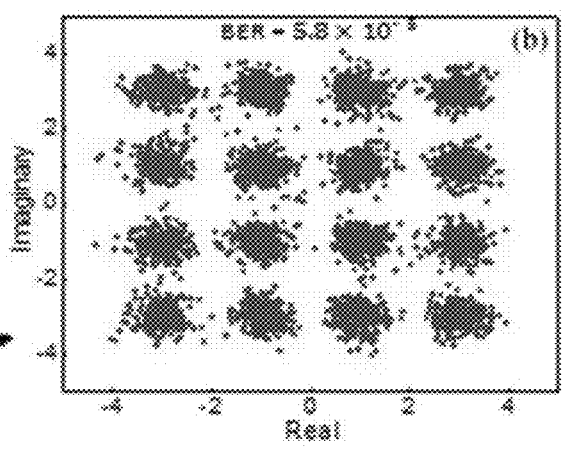
FIG. 7B illustrates a graphical view of a constellation diagram at 70 mA.

FIG. 7A and FIG. 7B illustrate BER performance of the blue LD 54 delivered 1-GHz 16-QAM-OFDM data as a function of laser bias current and the constellation diagram at 70 mA. FIG. 7A illustrates measured BER versus laser bias current. FIG. 7B illustrates a constellation diagram at 70 mA.

To implement the underwater 16-QAM-OFDM transmission, the bias current of the blue LD 54 was maintained at the optimized operating condition of 70 mA. To evaluate the overall 16-QAM-OFDM transmission performance over the 5.4-m underwater communication channel, the measured BER, SNR and constellation plot are shown in FIG. 8A, FIG. 8B and FIG. 8C.

Figure 8C:
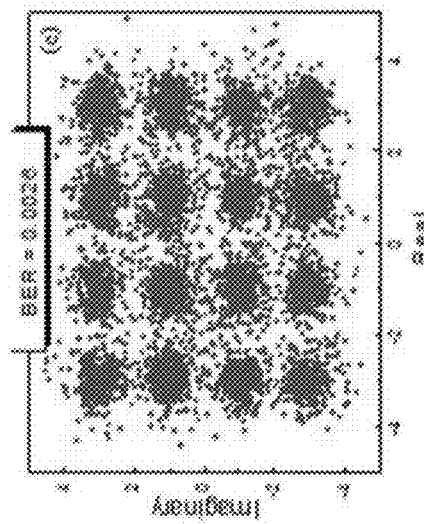
FIG. 8C illustrates a graphical view of a constellation map of 1.2-GHz 16-QAM-OFDM signals transmitted over the 5.4-m underwater channel.
Figure 8B:
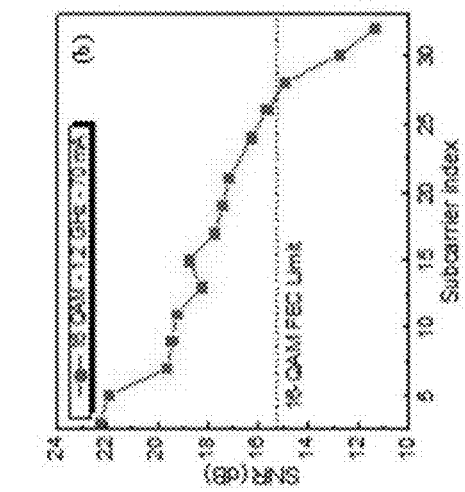
FIG. 8B illustrates a graphical view of measured electrical signal to noise ratios (SNRs) of the received 16-QAM-OFDM data as a function of subcarrier index.
Figure 8A:
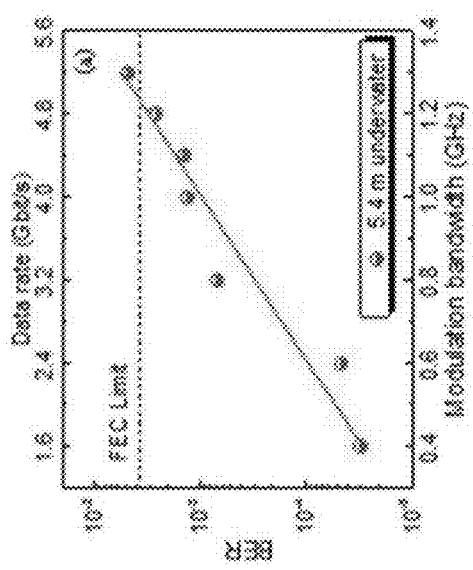
FIG. 8A illustrates a graphical view of measured BER of the 16-QAM-OFDM data versus modulation bandwidth.

FIG. 8A illustrates the measured BER of the 16-QAM-OFDM data versus modulation bandwidth. As illustrated, increasing the data bandwidth from 0.8 to 1.2 GHz enlarged the transmission capacity of the TO-9 packaged and fiber-pigtailed blue LD from 3.2 Gbit/s to 4.8 Gbit/s at the expense of degraded BER from $6.8 \times 10^{-4}$ to $2.6 \times 10^{-3}$. Further increasing the data bandwidth to 1.3 GHz lead to an increased BER of $4.8 \times 10^{-3}$, which was slightly above the FEC required BER of $3.8 \times 10^{-3}$. Therefore, to meet the FEC criterion, the acceptable bandwidth for the carried 16-QAM-OFDM was 1.2 GHz and the corresponding data rate was 4.8 Gbit/s.

FIG. 8B illustrates the measured electrical signal to noise ratios (SNRs) of the received 16-QAM-OFDM data as a function of subcarrier index. The measured SNR profile exhibited a negative slope and followed the overall frequency response depicted in FIG. 3. The SNR maintained high values at small subcarrier indices (low frequencies) and was inversely proportional to the subcarrier index. The average SNR at 70 mA was around 15.6 dB, which was higher than that of 15.19 dB required by the FEC decoding.

FIG. 8C illustrates the constellation map of 1.2-GHz 16-QAM-OFDM signals transmitted over the 5.4-m underwater channel. As shown in the figure, a clear constellation diagram can be obtained.

Figure 9:
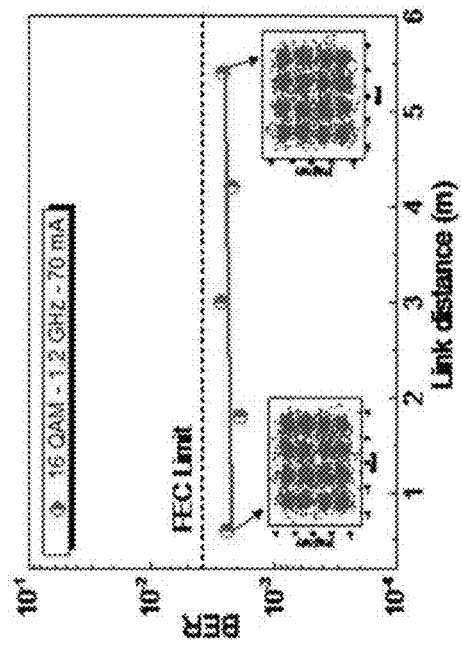
FIG. 9 illustrates a graphical view of measured BER versus link distance for the 1.2-GHz 16-QAM-OFDM signals.

Scattering effects, such as the temporal pulse spread (inter-symbol interference), were also evaluated in relation to overall system performance FIG. 9 illustrates the measured BER versus link distance for the 1.2-GHz 16-QAM-OFDM signals. The aim of this evaluation was to evaluate if the BER performance deteriorated as a function of link distance. It should be noted that the receiving optical power was kept constant by using a variable attenuator as the link distance was increased from 0.6 to 5.4 m. As shown in FIG. 9, a relatively flat BER was observed.

This example of a UWOC system required good pointing accuracy between the transmitter and receiver because the transmitter beam is collimated with a very small diameter. Expanding the transmitter beam to reduce the pointing accuracy requirement would result in a weaker beam at the receiver that would reduce the performance at longer ranges. In more turbid waters, scattering increases because of high concentration of organic and inorganic particulates and can cause significant temporal dispersion which can be thought of as a form of inter-symbol interference that will reduce the pointing accuracy because the beam will spread out leading to low SNR and poor BER. However, experimental results show that the scattering has no effect on BER performance of 1.2-GHz 16-QAM-OFDM signals during 5.4-m clear water communication link. For a 4.8 Gbit/s UWOC system, both the measured EVM of 16.5% and BER of $2.6 \times 10^{-3}$ pass the FEC criterion.

Figure 10:
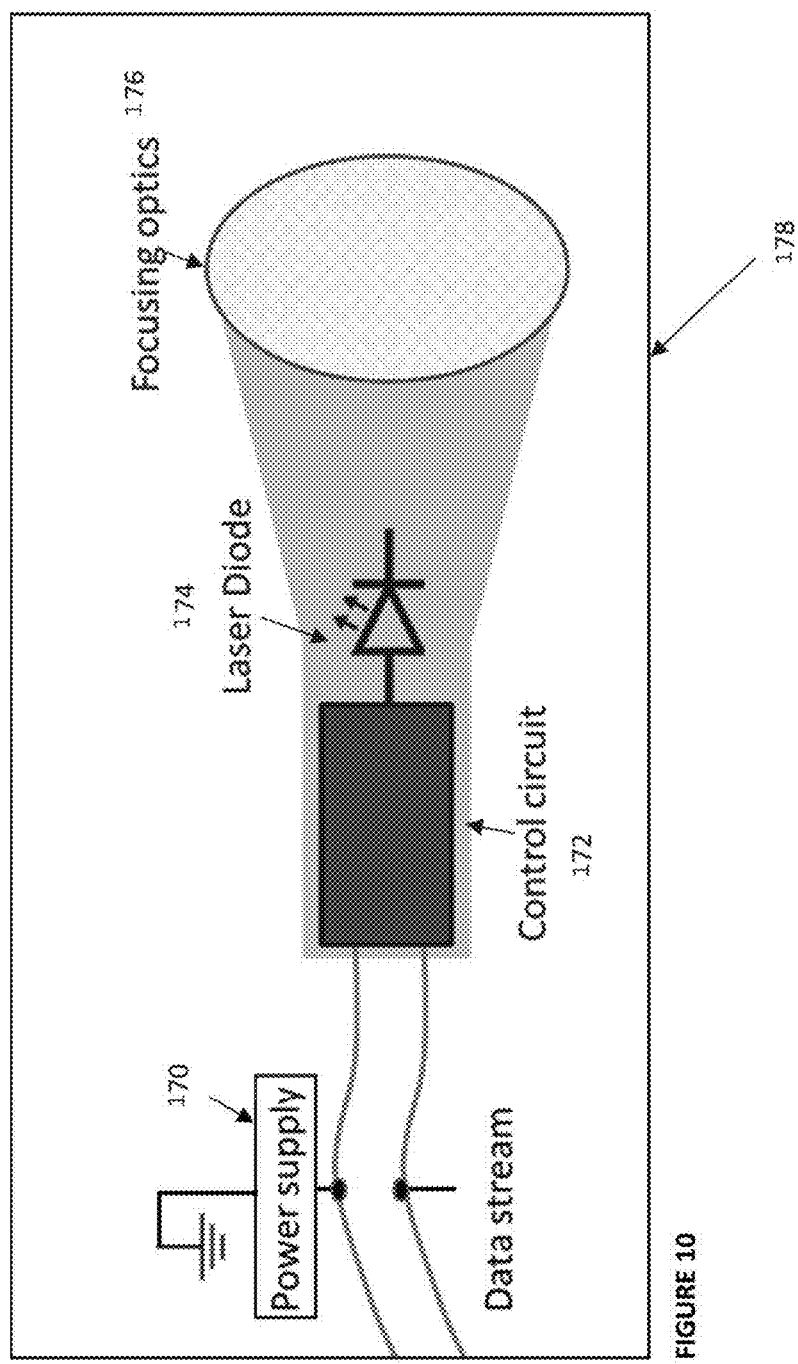
FIG. 10 illustrates a compact integrated underwater illumination, survey and optical communication system in accordance with one or more embodiments of the present disclosure.

FIG. 10 depicts a compact integrated underwater illumination, survey and optical communication system of the present invention. A power supply 170, control circuit 172, laser diode module 174, and focusing optics 176 can be embedded in the water-proof housing 178. The laser diode module 174 can have an integrated receiver unit for vision, and distance ranging measurement. The control circuit 172 integrates the functionalities of power stabilization, signal amplification and bias-tee combination to drive the laser diode unit 174. Phosphor material can be combined within the focusing optics to enable white light generation.

In other embodiments of the present disclosure, the transmitter module could be of different degree of coherency, such as edge-emitting laser, vertical-cavity surface emitting laser, and superluminescent diode. The transmitter module could be in standalone form or array form to increase the optical output power. In embodiments of the present disclosure, a single-mode 450 nm laser diode yielded favorable performance as compared to a multimode 405 nm violet laser.

The transmitting medium includes, but is not limited to, water, oil, and other organic liquid. The laser wavelength can cover a wide range of wavelength tailored to the specific low absorption and scattering nature of the transmitting medium.

In other embodiments, the photodetector can be an amplified biased photodetector, or a biased photodetector, or a UV-enhanced biased photodetector. The photodetector can be a photodetector based on, but not limited to, Si, or GaAs, or GaN or other III/V materials.

In some embodiments of the present disclosure, the receiver module can include one or multiple photodetectors. A UWOC system, when utilizing multiple laser diodes in the transmitter module and/or multiple photodetectors in the receiver module, may achieve a higher data rate (5 Gbit/s or above) and longer transmission distance (20 meters and above) when using an optical multi-input multi-output (MIMO) technique. A UWOC system, when utilizing multiple laser diodes in the transmitter module and/or multiple photodetectors in the receiver module, may achieve a higher data rate (5 Gbit/s or above) using wavelength division multiplexing (WDM) technique.

In other embodiments of the present disclosure, a UWOC system utilizing multiple laser diodes, including at least two of violet, blue, green, yellow, and red emitting laser diodes, may generate white light for both vision and communications underwater.

In still other embodiments of the present disclosure, a UWOC system utilizing a violet or blue laser combined with phosphor material in the transmitter module to generate white light, can be used for both underwater vision and communications. The phosphor material used for white light generation refers to a kind of color conversion material that can be excited by violet or blue laser and generate blue, green, yellow or red color. By mixing those colors, white light with different color rendering index and color temperature can be achieved. In other embodiments of the present disclosure, a UWOC system utilizing red-green-blue (RGB) lasers can be utilized to generate light at specific wavelength ranges. By mixing light from RGB lasers, light with different color rendering indices or color temperatures can be achieved. In yet other embodiments of the present disclosure, ultraviolet (UV) lasers can be utilized to provide both illumination and non-line-of-sight underwater communications.

What is claimed is:

1. A method of providing an underwater illumination source and data communication system, the method comprising:

generating a signal to drive multiple laser diodes in a transmitter module to provide a white light illumination field of sufficient intensity and duration to illuminate an underwater field of interest during an underwater activity, with said laser diodes being contained in a waterproof housing along with a control circuit and focusing optics, and said multiple laser diodes serving as a white light source to illuminate an underwater structure for an underwater vision application; and utilizing the multiple laser diodes, control circuit and focusing optics in an optical communications systems to also convey information away from the underwater field of interest while simultaneously continuing to illuminate the underwater field of interest with white light, said utilizing including:

with said focusing optics, optically directing at least some of the light from said multiple laser diodes away from the waterproof housing and toward a remote underwater location;

at said remote underwater location, receiving said at least some of the optically-directed light and further processing received light into an information signal to yield an optically-delivered data stream during said underwater activity; and at a receiver module contained within the water-proof housing, receiving light from the remote underwater location to conduct duplex communication using a plurality of photodetectors within the receiver module.

2. The method of claim 1, wherein the field of interest includes an underwater vehicle, a diver, or a sea floor.

3. The method of claim 2, wherein said optically directing includes focusing a light beam and directing a focused light beam toward the remote underwater location.

4. The method of claim 3, wherein the focused light beam defines a plurality of parallel beams.

5. The method of claim 4, wherein said receiving including directing the light beam onto a silicon-based avalanche photodiode.

6. The method of claim 1, wherein said optical communication systems includes a spectrally efficient modulation scheme.

7. The method of claim 6 wherein the modulation scheme includes QAM-OFDM.

8. The method of claim 1, wherein said multiple laser diodes includes a plurality of violet or blue light lasers and a phosphor material is used to color convert light from the plurality of violet or blue light lasers into white light.

9. The method of claim 1, wherein said waterproof housing also includes a power supply for said multiple laser diodes.

10. The method of claim 1, wherein said multiple laser diodes includes an ultraviolet laser.

11. An underwater light system comprising:
a waterproof housing;
a transmitter module contained in the housing and receiving a data stream and controlling a laser diode light source to provide an optical signal and to provide illumination to serve as a white light source for an underwater vision application at the same time, with said underwater vision application remotely viewing an underwater structure;
a transmitter lens within the housing for focusing and directing the optical signal toward a remote underwater location;
a first receiver module at the remote location for receiving and processing the optical signal to yield the data stream while said light source simultaneously illuminates the underwater structure to conduct remote underwater vision proximate to the light source; and
a second receiver module within the waterproof housing containing a plurality of photodetectors receiving light from the remote underwater location to conduct communication with the remote underwater location.

12. The light system of claim 11, wherein the first receiving module includes a receiver lens for focusing the optical signal toward a silicon avalanche photodiode.

13. The light system of claim 11, wherein the light source is housed on an underwater vehicle or structure or diver.

14. The light system of claim 11, wherein the waterproof housing also contains a power supply and a control circuit for the laser diode light source.

15. The light system of claim 11, wherein the transmitter module processes the data stream with a spectrally efficient modulation scheme to increase a data delivery rate.

16. The light system of claim 11, wherein the light source includes red, green and blue lasers.

17. An underwater light system comprising:
a transmitter contained in a waterproof housing and receiving a data stream and controlling a laser diode light source to provide an optical signal;
a lens within the waterproof housing for focusing and directing the optical signal toward a remote underwater location;
a first receiver at the remote location for receiving and processing the optical signal to yield the data stream while said laser diode light source simultaneously illuminates a field of interest with white light of sufficient intensity and duration to conduct remote underwater observation proximate to the light source using a remote underwater vision device; and
a second receiver within the waterproof housing containing a plurality of photodetectors receiving light from the remote underwater location to conduct communication with the remote underwater location.

18. The underwater light system of claim 17 further comprising a receiver lens for focusing and directing the optical signal toward a photodiode.

19. The underwater light system of claim 17 wherein the light source includes red, green and blue lasers or an ultraviolet laser.

20. The underwater light system of claim 17 wherein the waterproof housing contains a power supply for the laser diode light source.

* * * * *